(12) United States Patent
Henrici et al.

(10) Patent No.: US 6,422,716 B2
(45) Date of Patent: Jul. 23, 2002

(54) MODULAR LED ASSEMBLY

(75) Inventors: Dieter Henrici; Hans Wedding, both of Arnsberg (DE)

(73) Assignee: BJB GmbH & Co. KG, Arnsberg (DE)

( * ) Notice: Subject to any disclaimer, the term of this patent is extended or adjusted under 35 U.S.C. 154(b) by 0 days.

(21) Appl. No.: 09/809,642

(22) Filed: Mar. 15, 2001

(30) Foreign Application Priority Data

Mar. 16, 2000 (DE) .......................................... 100 12 734

(51) Int. Cl.7 .............................................. F21V 21/00
(52) U.S. Cl. ...................... 362/249; 362/282; 362/545; 362/238; 362/800; 313/500; 361/729; 361/735
(58) Field of Search ................................ 362/249, 800, 362/545, 238, 252; 313/500; 361/774, 803, 729, 735; 257/99; 439/877

(56) References Cited

U.S. PATENT DOCUMENTS

| | | | | |
|---|---|---|---|---|
| 4,445,132 A | * | 4/1984 | Ichikawa et al. | 257/32 |
| 4,843,280 A | | 6/1989 | Lumbard | |
| 5,404,282 A | | 4/1995 | Klinke | |
| 5,436,809 A | * | 7/1995 | Brassier | 362/61 |
| 5,660,461 A | * | 8/1997 | Igatius et al. | 362/241 |
| 5,857,767 A | * | 1/1999 | Hochstein | 362/294 |

FOREIGN PATENT DOCUMENTS

| | | |
|---|---|---|
| DE | 298 18 609 | 3/1999 |
| DE | 199 14 281 | 3/2000 |
| JP | 07115228 | 2/1995 |

* cited by examiner

*Primary Examiner*—Sandra O'Shea
*Assistant Examiner*—Ali Alavi
(74) *Attorney, Agent, or Firm*—Herbert Dubno; Andrew Wilford

(57) ABSTRACT

Two substantially identical LED modules each have a nonconductive base having a straight edge and a pair of faces, at least one LED on the base, and two conductive traces on the base connected to the LED and forming on one of the faces inner and outer contacts spaced along a line perpendicular from the edge with the outer contact between the inner contact and the edge. The modules are juxtaposed at the edges with the lines aligned with each other and the one faces generally coplanar. A clip has a nonconductive body bearing on the one faces of both of the bases at the edges and two respective conductors on the clip body having portions spaced apart along the aligned lines and bearing on the contacts of both bases. The clip body and conductors are pressed against the bases to engage the conductors with the respective contacts and secure the bases together.

12 Claims, 7 Drawing Sheets

MODULAR LED ASSEMBLY

FIELD OF THE INVENTION

The present invention relates to a modular light-emitting-diode (LED) assembly. More particularly this invention concerns an assembly of a plurality of identical discrete LED modules that are energized jointly to provide illumination or backlighting.

BACKGROUND OF THE INVENTION

In recent times LED's have grown in popularity because of their durability and low energy consumption. They can be built into portable equipment where power is at a premium, where the heat generated by standard incandescent or fluorescent lamps cannot be tolerated, and where long service life and durability are critical.

As a result of the low output of the typical LED, they must be used in arrays. German patent 199 14 281 of A. Toteberg, German Utility Model 298 18 609 assigned to Insta Elektro, and U.S. Pat. No. 5,404,282 of R. Klinke all describe various systems for coupling together a multiplicity of LED's so that they can be energized from a single source, and even where some can be energized from one source and some from another. In these systems the LED modules are permanently connected together by the manufacturer in the desired array.

The typical module carries a subarray of, for instance, four LED's. The LED's themselves are surface-mounted devices carried on a small printed-circuit board also provided with the necessary conductor paths and resistors needed for however many LED's it carries. The smallest assembly is 2×3 or 4×6 so as to provide the necessary light output. Such small subassemblies are in turn joined together to form larger subassemblies, as used for example as a computer backlight or motor-vehicle brake lamp.

These systems have a common failing, namely that it is impossible to service such an assembly in the field by replacing one or more of the numerous LED modules. It is also impossible or extremely difficult to make up a custom assembly, for instance one where within the array a pattern of the LED modules is formed which emits a different color of light or no light at all so as to spell out a message or create an artistic effect. Even when such an assembly is made up in a custom manufacturing process, it is impossible to alter it at a later date without returning it to the manufacturer, and even then replacement rather than repair is the order of the day.

OBJECTS OF THE INVENTION

It is therefore an object of the present invention to provide an improved LED assembly.

Another object is the provision of such an improved LED assembly which overcomes the above-given disadvantages, that is which can be assembled and disassembled without the use of complex tools or equipment.

A further object is to provide a LED assembly which can be serviced and even reconfigured easily, in the field.

SUMMARY OF THE INVENTION

According to the invention two substantially identical LED modules each have a nonconductive base having a straight edge and a pair of faces, at least one LED on the base, and two conductive traces on the base connected to the LED and forming on one of the faces inner and outer contacts spaced along a line perpendicular from the edge with the outer contact between the inner contact and the edge. The modules are juxtaposed at the edges with the lines aligned with each other and the one faces generally coplanar. A clip has a nonconductive body bearing on the one faces of both of the bases at the edges, two respective conductors on the clip body having conductive portions spaced apart along the aligned lines and bearing on the contacts of both bases, and means for pressing the clip body and conductors against the bases and engaging the conductors with the respective contacts.

Thus with this system the clip mechanically and electrically interconnects the two modules together. This makes it possible to assemble the modules in any desired array, and even to take any of the modules out of the array. No tools are needed to make up an assembly according to the invention or to take it apart. As a result of the in-line arrangement of the contacts, the entire assembly can be made quite flat.

The contacts can extend through the respective bases and are exposed on both faces thereof. This allows connection to differently polarized LED's. A conductor could even be provided in both parts of the clip for engagement with traces on opposite faces of the module circuit board.

The modules are formed at predetermined spacings from the respective edges with seats open toward the clip body. The clip body in turn is formed with respective centering pins engaged in the seats. In this manner the mechanical coupling of the two bases is quite robust. The clip body has a pair of elastically deflectable arms carrying the centering pins so that the clip can be snapped in a direction parallel to the planes of the bases onto the bases. Furthermore the pins and seats lie on the line, making interfitting and alignment of the elements of the assembly quite easy. Both of the seats are spaced identically from the respective edges.

Each of the conductors has one end fixed to the clip body and an opposite end forming the conductive portions engageable with the respective contacts. Each of the conductors is thin and elastically deformable, typically being made of a thin piece metal having a springy core and a conductive surface. Their opposite ends are formed as a pair of arms forming the respective conductive portions. The base according to the invention is formed with a pair of mounting pins and the one ends of the conductors are formed with lips elastically gripping the respective mounting pins.

In accordance with the invention a cover fixed to the clip body bears on the other faces of both of the bases at the edges. This cover has at least one barb arm extending through and clipping it to the base. Thus the clip body and cover form a pair of parts that together embrace the two juxtaposed modules, simultaneously electrically and mechanically interconnecting them.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
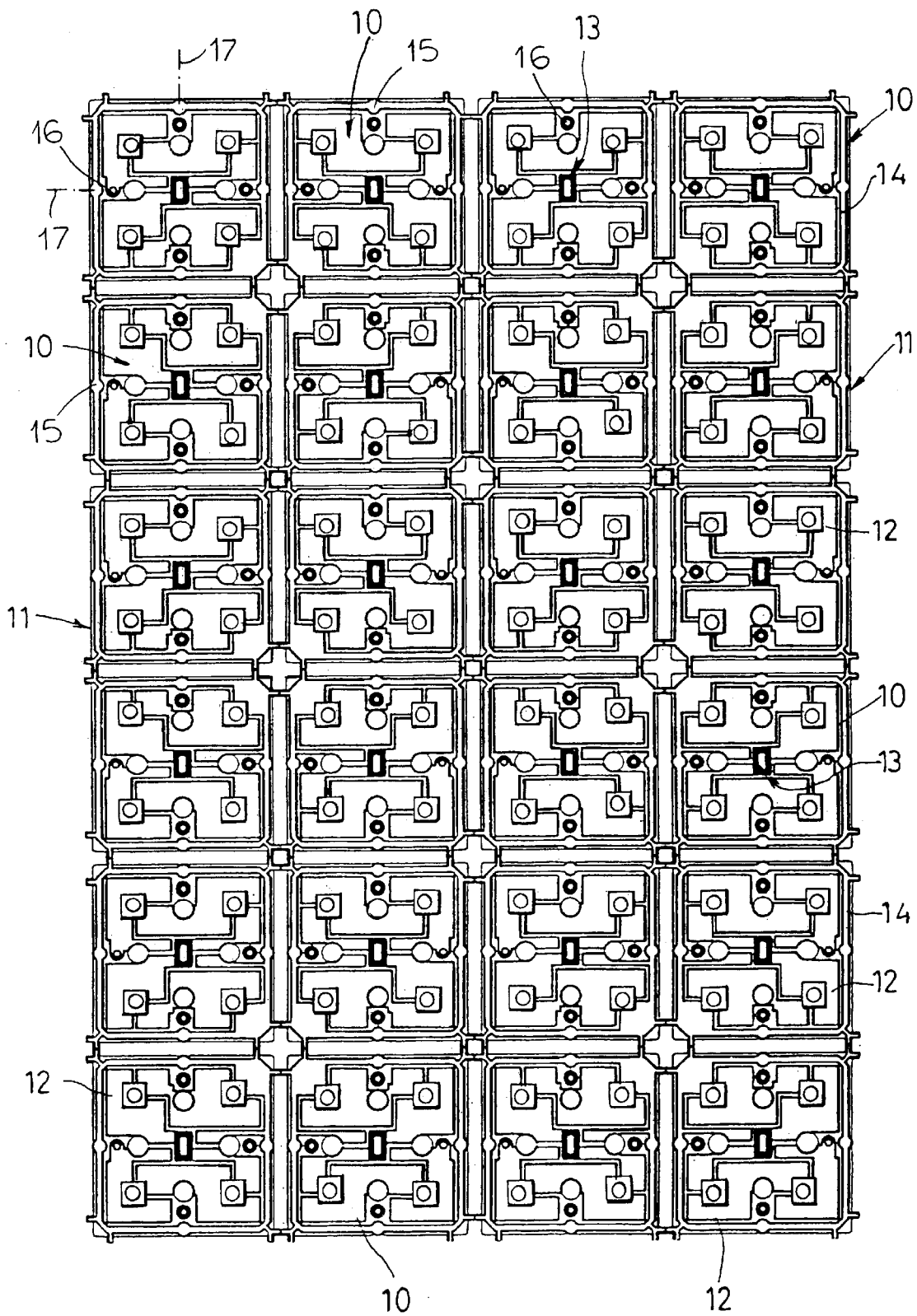
FIG. 1 is an array of unconnected LED modules.
Figure 2:
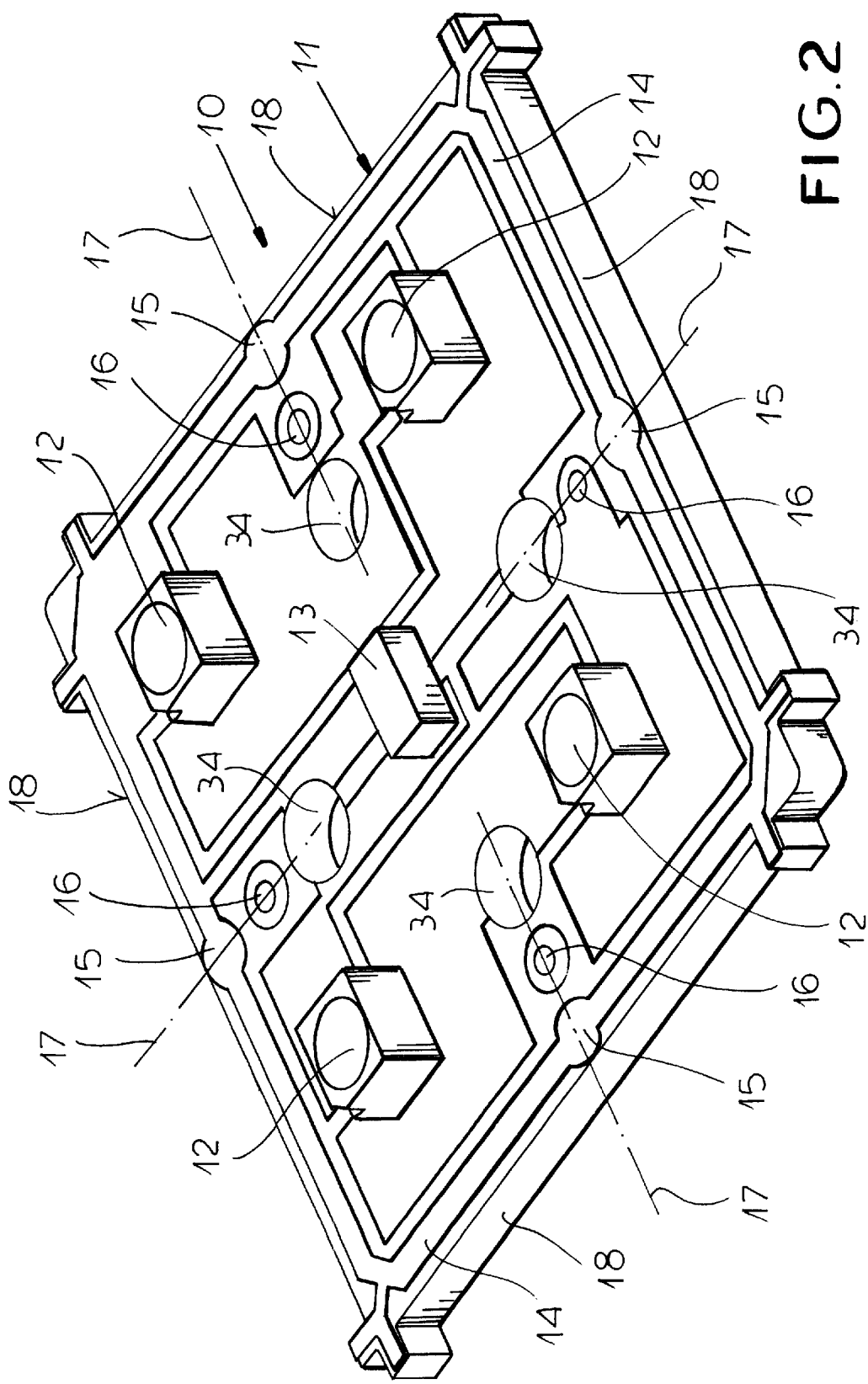
FIG. 2 is a large-scale perspective view of one of the modules.

As seen in FIGS. 1 and 2 a LED module 10 is basically comprised of a square plastic base plate 11 here carrying four surface-mount LED's 12 in a square array. The insulating plate 11 also carries at least one resistor 13 and conductive paths or traces 14 that electrically interconnect the cathodes and anodes of all the LED's 12 in the standard manner. Instead of a square shape the plates 11 could be triangular, pentagonal, or any other desired polygonal shape, for instance hexagonal for honeycomb pattern when arrayed next to one another as shown in FIG. 1.

Furthermore each LED module 10 has a plurality of straight outer edges 18 and the traces 14 form at a perpendicular centerline 17 of each edge 18 a pair of contacts 15 and 16. All the outer contacts 15 are interconnected and are at exactly the same spacing along the respective transverse centerline 17 from the respective edge 18, and all the inner contacts 16 are spaced inward, also a uniform distance on the line 17. To energize the LED's, a plus voltage is applied to one of the outer contacts 15, and a lower or negative voltage to one of the inner contacts 16. FIG. 1 shows how the lines 17 of adjacent modules 10 are aligned so that adjacent contacts 15 and 16 of adjacent modules 10 and be interconnected.

Figure 3:
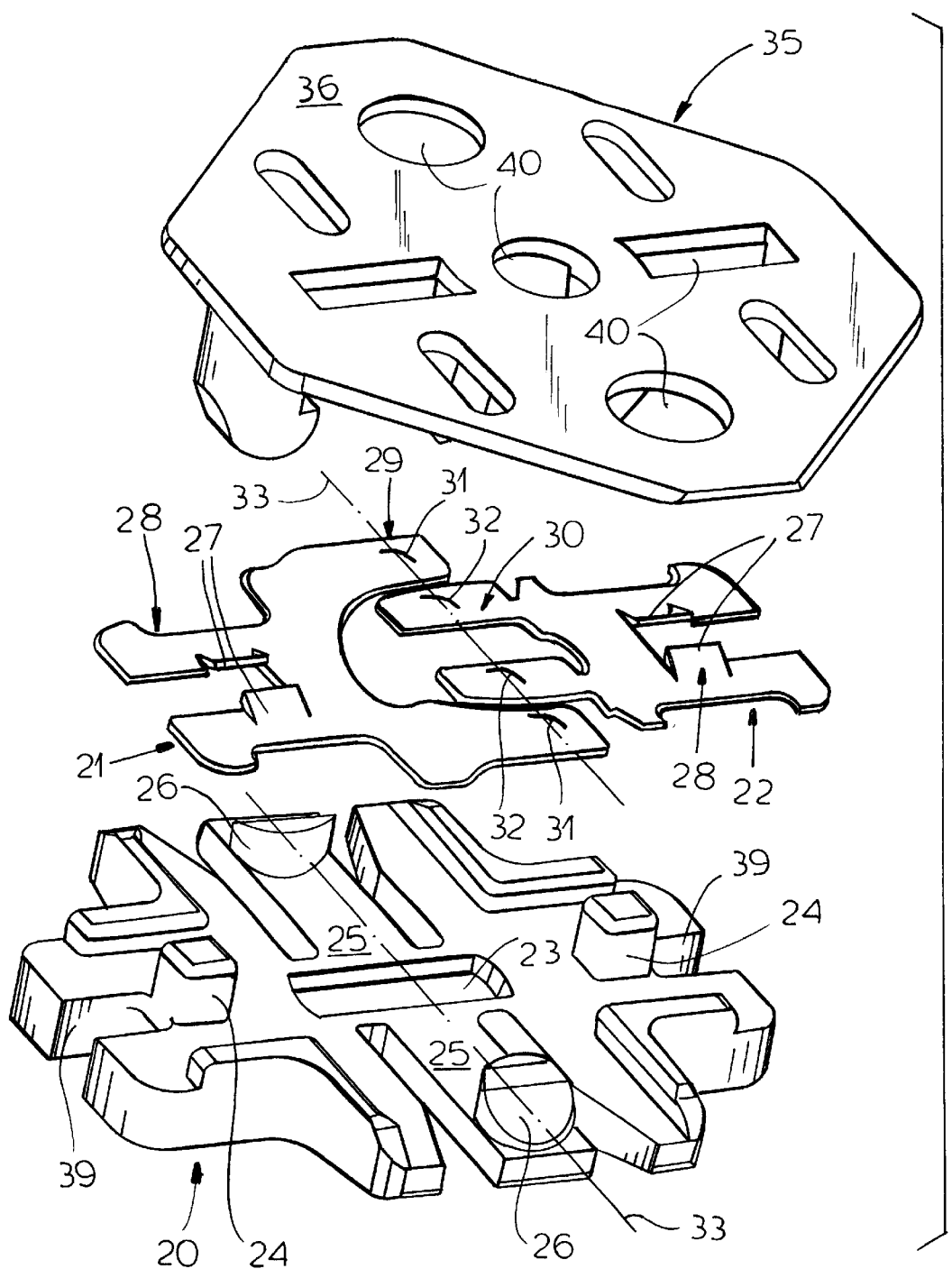
FIGS. 3 and 4 are exploded views from below and above of a clip for mechanically and interconnecting adjacent LED modules according to the invention.
Figure 4:
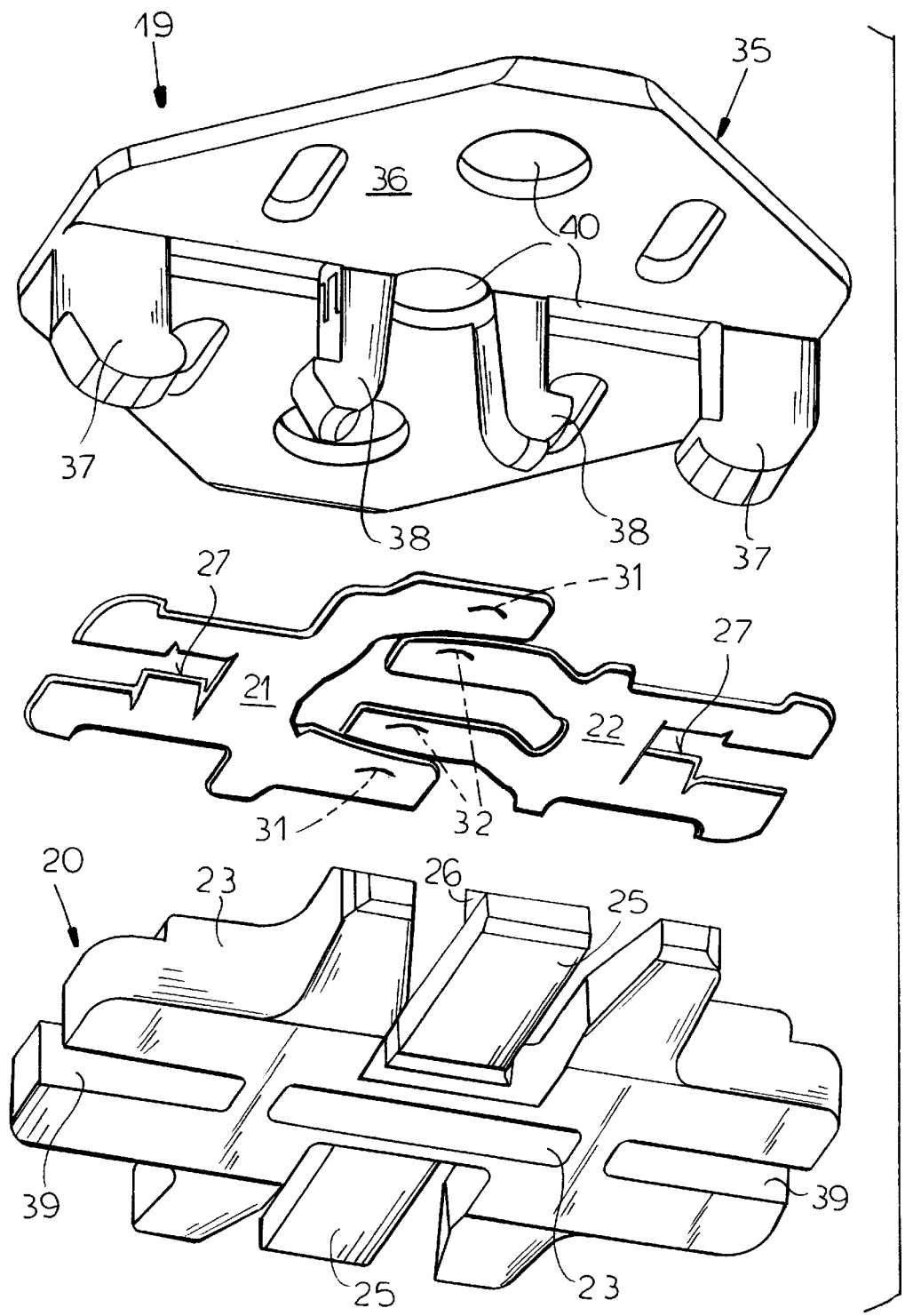
Figure 5:
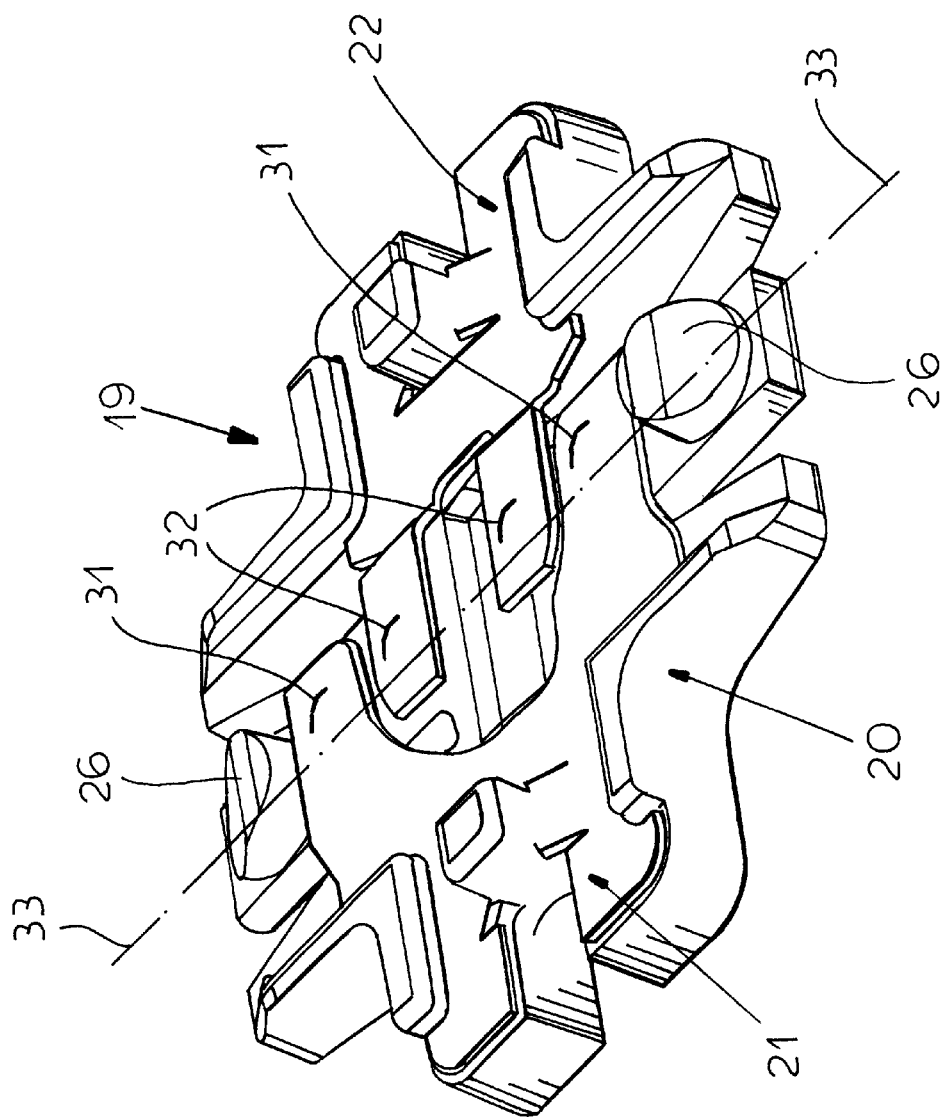
FIG. 5 is a perspective view of the base of the clip of FIGS. 3 and 4.

According to the invention the modules 10 are electrically and mechanically interconnected by two-part clips 19 shown in detail in FIGS. 3, 4, and 5. Each such clip 19 comprises a dielectric base plate 20, a pair of conductive conductors 21 and 22, and a dielectric top plate or cover 35. The conductors 21 and 22 are formed of metal, for instance thin copper-coated sheet steel, and the parts 20 and 35 of a durable and stiff plastic.

The base plate 20 is cruciform and is formed with a pair of upstanding square-section mounting pins 24 that are engaged by spring lips 27 of arms 28 of the conductors 20 and 21 as best shown in FIG. 5. Thus once the conductors 21 and 22 are pressed down on the pins 24, they are permanently mounted on the base plate 20. In addition the plate 20 has a pair of arms 25 carrying centering pins 26 adapted to fit in holes 34 formed in the modules 12 (FIG. 2) and spaced apart along a line 33 that aligns with the line 17 in the finished assembly. The plate 20 is formed in line with the pins 24 with a center cutout 23 and two outer notches 39. The conductors 21 and 22 are formed with arms 29 and 30 that are in turn formed with bumps 31 and 32 also lying on the line 33 and spaced apart like the contacts 15 and 16 as will be described below.

The cover 35 comprises a plate 36 from which extend gripper arms 37 that engage through the notches 39 and arms 38 that engage through the hole 23. The ends of these arms 37 and 38 are formed as barbs that, once they are pushed through the plate 20, they snap into place to lock the two parts 20 and 35 together. The plate 36 is formed between the arms 37 and 38 and in line with the pins 26 with through-going apertures 40.

Figure 6:
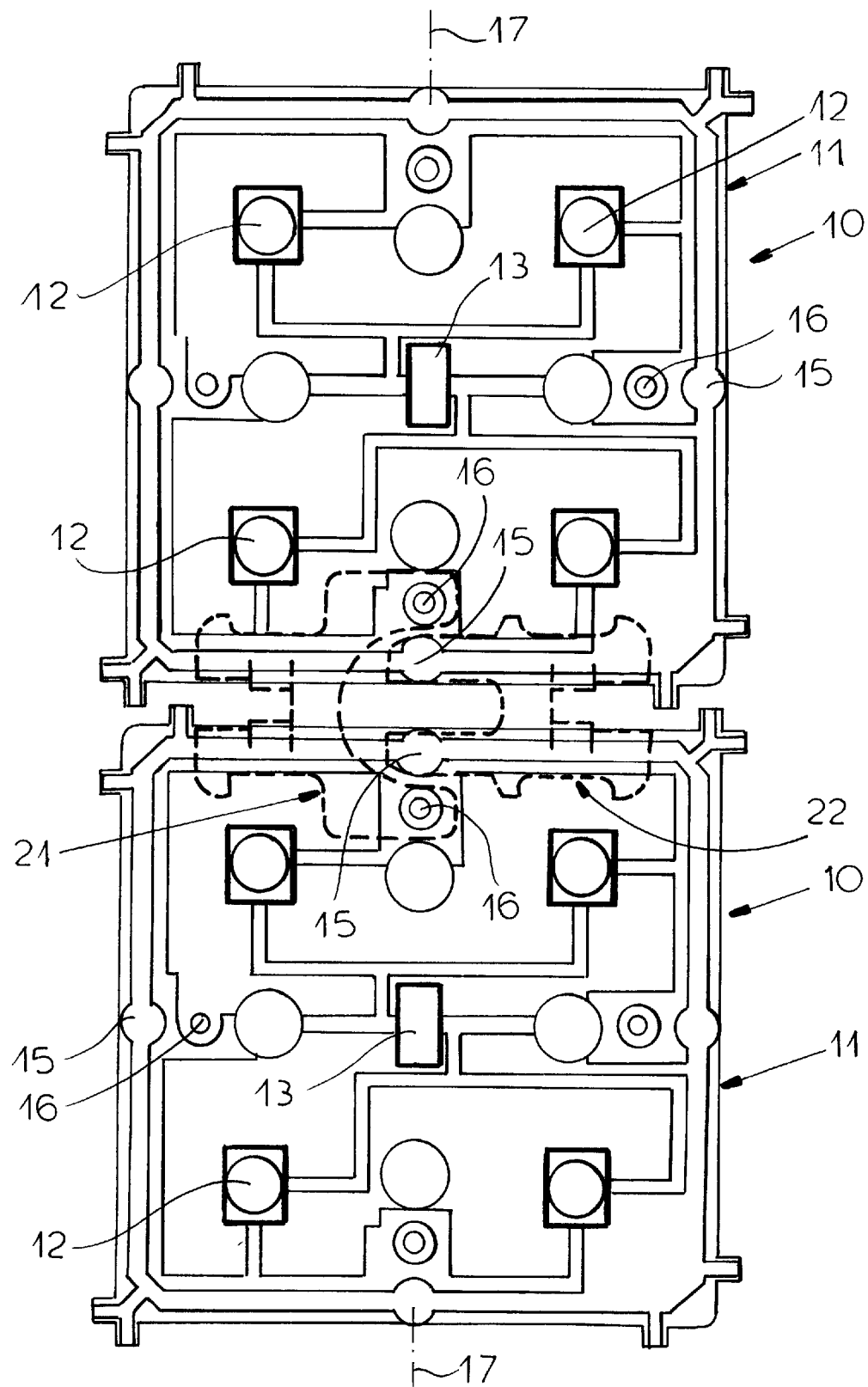
FIG. 6 is a schematic large-scale top view illustrating how the clip of this invention fits with two adjacent LED modules.
Figure 7:
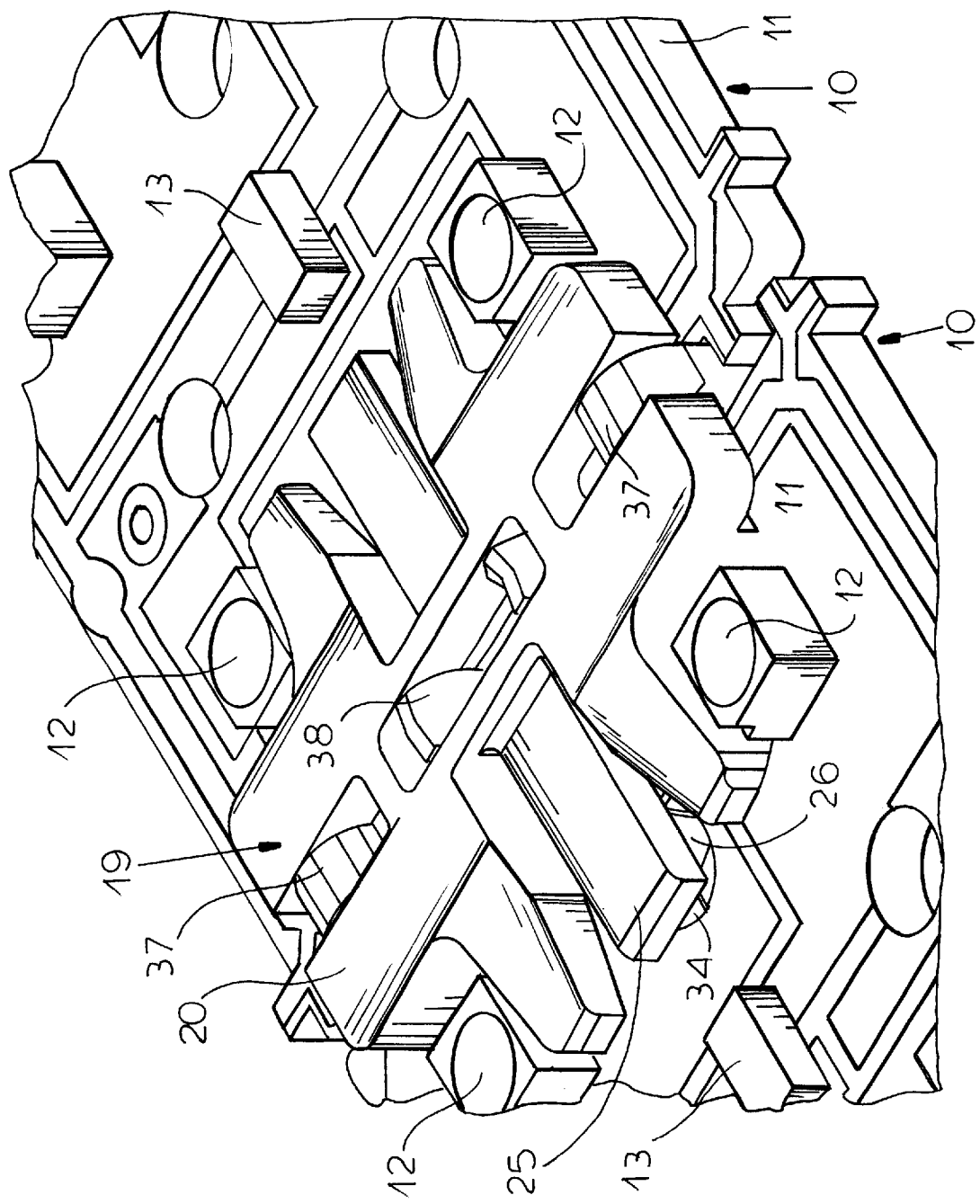
FIG. 7 is a large-scale perspective view from above showing two modules interconnected in accordance with the invention.

According to the invention as shown in FIGS. 6 and 7 two of the modules 10 are juxtaposed with their lines 17 aligned and their edges 18 spaced parallel to each other far enough to pass the barb arms 37 and 38 as will be described below. Then the plate 20 with the conductors 21 and 22 is pressed down to fit the pins 26 into the holes 34. This brings the contact bumps 31 into contact with both of the inner contacts 16 and the bumps 32 into contact with both of the outer contacts 15. Then the cover 35 is pushed from below into place until the arms 37 and 38, which pass between the edge 18, snap into position, locking the cover 35 to the bottom face of the modules 10 while the plate 20 is engaged down on the top face.

The result is solid mechanical interconnection of the modules 10 and good electrical interconnection of the traces 14. The plate 20 has a thickness which is not greater than the height of the LED's 12 so that the clip 19 does not interfere with mounting the thus coupled modules 10 when needed. In fact the clip parts 20 and 35 have planar outer surfaces that, in the finished modules, define the thickness of the assembly, with the modules 12 suspended in the clips 19.

The assembly can be taken apart by prying apart the arms 37 and 38 to free the cover 35, which can be done also by inserting a simple tool like a screwdriver through the appropriate hole 40. Alternately the inner end of each retaining pin 26 is exposed at one of the holes 40 so it can be pushed back out to free the respective module 12 to slip out from between the clip parts 20 and 35.

The top surfaces of the retaining pins 26 are beveled and the arms 25 they carry are elastically deformable. Thus it is also possible to push the clipped-together parts 20 and 35 over the edge 18, thereby camming out the pin 26 until it snaps into the hole 34. If assembling an array from one end, this is an efficient way to use the clip 19 according to the invention, but if the layout must be formed before the modules 12 are interconnected, the clips 19 must be assembled on the modules 12.

In addition the traces 14 can extend through the base plate 11 so that contact can be made with them on both faces of the plate 11. Thus the conductor 21, for instance, could be mounted on the plate 20 and the conductor 22 on the plate 36.

With this arrangement it is therefore possible to make up an array of any desired configuration, and to change this configuration in the field with no tools. Within the array a pattern of the LED modules 10 can be left out to form a letter, spell a word, or make any desired pattern, or similarly modules of different color or light intensity can be installed in any pattern for the same effect. The apertures 40 in the plate 36 allow disassembly in the field of an array to replace a defective module 12 or reconfigure the array.

We claim:
1. An assembly comprising:
two substantially identical LED modules each having
a nonconductive base having a straight edge and a pair of faces,
at least one LED on the base, and
two conductive traces on the base connected to the LED and forming on one of the faces inner and outer contacts spaced along a line perpendicular from the edge with the outer contact between the inner contact and the edge, the modules being juxtaposed at the edges with the lines aligned with each other and the one faces generally coplanar; and
a clip having
a nonconductive body bearing on the one faces of both of the bases at the edges,
two respective conductors on the body having conductive portions spaced apart along the aligned lines and bearing on the contacts of both bases, and
means for pressing the body and conductors against the bases and engaging the conductors with the respective contacts.

2. The assembly defined in claim 1 wherein the contacts extend through the respective bases and are exposed on both faces thereof.

3. The assembly defined in claim 1 wherein the modules are each formed at predetermined spacings from the respective edges with seats open toward the clip body, the clip body being formed with respective centering pins engaged in the seats.

4. The assembly defined in claim 3 wherein the clip body has a pair of elastically deflectable arms carrying the centering pins.

5. The assembly defined in claim 3 wherein the pins and seats lie on the line.

6. The assembly defined in claim 5 wherein both of the seats are spaced identically from the respective edges.

7. The assembly defined in claim 1 wherein each of the conductors has one end fixed to the clip body and an opposite end forming the conductive portions engageable with the respective contacts.

8. The assembly defined in claim 7 wherein each of the conductors is thin and elastically deformable.

9. The assembly defined in claim 7 wherein the opposite ends are formed as a pair of arms forming the respective conductive portions.

10. The assembly defined in claim 7 wherein the base is formed with a pair of mounting pins and the one ends of the conductors are formed with lips elastically gripping the respective mounting pins.

11. The assembly defined in claim 1 wherein the means is a cover fixed to the clip body and bearing on the other faces of both of the bases at the edges.

12. The assembly defined in claim 11 wherein the cover has at least one barb arm extending through and clipping it to the base.

* * * * *